(12) United States Patent
Arsovski et al.

(10) Patent No.: US 8,654,594 B2
(45) Date of Patent: Feb. 18, 2014

(54) VDIFF MAX LIMITER IN SRAMS FOR IMPROVED YIELD AND POWER

(75) Inventors: Igor Arsovski, Williston, VT (US); George M. Braceras, Essex Juncton, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 13/403,252

(22) Filed: Feb. 23, 2012

(65) Prior Publication Data

US 2013/0223161 A1  Aug. 29, 2013

(51) Int. Cl.
*G11C 11/412* (2006.01)

(52) U.S. Cl.
USPC ..................... 365/189.06; 365/154

(58) Field of Classification Search
USPC ............................ 365/189.06, 154
See application file for complete search history.

(56) References Cited

U.S. PATENT DOCUMENTS

| | | | |
|---|---|---|---|
| 6,711,071 B2 | 3/2004 | Mizuno et al. | |
| 7,502,275 B2 | 3/2009 | Nii et al. | |
| 7,675,794 B2 | 3/2010 | Behrends et al. | |
| 7,710,796 B2 | 5/2010 | Cottier et al. | |
| 7,715,223 B2 | 5/2010 | Maeda et al. | |
| 7,952,909 B2 * | 5/2011 | Inoue et al. | 365/148 |
| 2002/0188898 A1 * | 12/2002 | Tsuji | 714/718 |
| 2003/0189849 A1 | 10/2003 | Khellah et al. | |
| 2010/0163832 A1 * | 7/2010 | Kau | 257/4 |
| 2012/0106237 A1 * | 5/2012 | Dengler et al. | 365/154 |
| 2012/0320658 A1 * | 12/2012 | Wang et al. | 365/148 |

OTHER PUBLICATIONS

Chen, Yen Huei et al., Journal Paper (JP), "A 0.6 V dual-rail compiler SRAM design on 45 nm CMOS technology with adaptive SRAM power for lower VDD_min VLSIs", Journal: IEEE Journal of Solid-State Circuits, vol. 44, No. 4, pp. 1209-1215.

\* cited by examiner

*Primary Examiner* — Michael Tran
(74) *Attorney, Agent, or Firm* — Gibb & Riley, LLC; David A. Cain, Esq.

(57) ABSTRACT

An integrated circuit structure comprises a static random access memory (SRAM) structure and a logic circuit. A power supply is operatively connected to the SRAM structure, and provides a first voltage to the SRAM structure. A voltage limiter is operatively connected to the power supply. The voltage limiter comprises a switching device operatively connected to the power supply. The switching device receives the first voltage and a second voltage supplied to structures external to the SRAM structure. A resistive element is operatively connected to the switching device. The switching device connects the resistive element to the power supply. The resistive element is selected to enable an output from the switching device to the logic circuit when a difference between the first voltage and the second voltage is greater than a voltage threshold value of the switching device.

20 Claims, 2 Drawing Sheets

VDIFF MAX LIMITER IN SRAMS FOR IMPROVED YIELD AND POWER

BACKGROUND

The present disclosure relates to a voltage limiter for use with a Static Random-Access Memory (SRAM), and more specifically, to an integrated circuit structure to limit the maximum differential between the SRAM power supply voltage and peripheral logic voltage.

Semiconductor memories designed in deep sub-micron technology nodes suffer from large random device variation, which in turn limits the voltage scaling of the SRAMs. To continue power scaling, the traditional single-power-supply SRAM has been modified to be powered with two or more unique voltage power supplies. Two of the most common power-supplies used are the SRAM cell power supply (referred to as Vcs) and the peripheral logic power supply (referred to as Vdd). Splitting the supplies allows the Vdd voltage to continue to scale down to a lower voltage and reduce power, while maintaining Vcs at a higher voltage to improve SRAM cell functionality and reliability.

With SRAM often accessed in bursts, resulting in many memory accesses during some time periods, interspersed with long periods when memory accesses are not required, leakage power on the higher-voltage Vcs supply is quickly becoming the dominant component of overall SRAM power consumption. To reduce power, many SRAM designs have a built-in lower power mode, also known as "light sleep", where the SRAM introduces a voltage drop ($\Delta V$) from Vcs to a lower internal SRAM cell voltage (V_Vcs). While in this mode, the SRAM cell voltage is lowered to a value that maintains the state of the SRAM cell, but is below the voltage that the SRAM can actively operate. Since this lower internal voltage V_Vcs is a strong function of the external Vcs voltage, conventional technologies provide systems that could create a large differential between the SRAM cell power supply voltage level (Vcs) and SRAM peripheral logic (Vdd), which can not only burn more Vcs power, but also induce failures when writing to the SRAM. Although a light sleep mode, the common power-supply implementation on more than 90% of today's chips, is well suited for reducing power when Vcs=Vdd, the V_Vcs voltage drop is still much larger than is required to maintain functionality and performance.

SUMMARY

According to one embodiment herein, an integrated circuit structure comprises a static random-access memory (SRAM) structure and a logic circuit. A power supply is operatively connected to the SRAM structure, and provides a first voltage to the SRAM structure. A voltage limiter is operatively connected to the power supply. The voltage limiter comprises a switching device operatively connected to the power supply. The switching device receives the first voltage and a second voltage supplied to structures external to the SRAM structure. A resistive element is operatively connected to the switching device. The switching device connects the resistive element to the power supply. The resistive element is selected to enable an output from the switching device to the logic circuit when a difference between the first voltage and the second voltage is greater than a voltage threshold value of the switching device.

According to another embodiment herein, an integrated circuit structure comprises an SRAM structure and a logic circuit. A power supply is operatively connected to the SRAM structure. The power supply provides a first voltage to the SRAM structure. A voltage limiter is operatively connected to the power supply. The voltage limiter comprises a switching device operatively connected to the power supply, the switching device receives the first voltage and receives a second voltage supplied to structures external to the SRAM structure. A resistive element is operatively connected to the switching device. The switching device connects the resistive element to the power supply. The resistive element is selected to enable an output from the switching device to the logic circuit when a difference between the first voltage and the second voltage is greater than a voltage threshold value of the switching device.

According to yet another embodiment herein, an integrated circuit structure comprises an SRAM structure and a logic circuit, comprising an OR gate. A power supply is operatively connected to the SRAM structure through a voltage regulator. The power supply provides a first voltage to the SRAM structure. A voltage limiter is operatively connected to the power supply. The voltage limiter comprises at least one transistor operatively connected to the power supply, the at least one transistor receives the first voltage and receives a second voltage supplied to structures external to the SRAM structure. At least one resistor is operatively connected to the at least one transistor. The at least one transistor connects the at least one resistor to the power supply. The at least one resistor is selected to enable an output from the at least one transistor to the logic circuit when a difference between the first voltage and the second voltage is greater than a voltage threshold value of the at least one transistor.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, conventional systems having a large differential between the SRAM cell power supply voltage level (Vcs) and SRAM peripheral logic voltage level (Vdd) can induce failures when writing to the SRAM. Furthermore, such a large differential voltage consumes significantly higher power than is necessary for operation of the SRAM. A circuit is needed to limit the voltage applied to the SRAM. In one example, a small Vcs regulator is built into a large SRAM bank. The systems and methods herein address these issues by disclosing a simple circuit that can be interfaced with existing Vcs regulator to limit the maximum differential between Vcs and Vdd.

An embodiment described herein provides a structure for limiting the potential difference between the SRAM cell power supply and the SRAM peripheral power supply to minimize SRAM write fails and reduce power consumption. A power delivery system is integrated into an SRAM structure with a voltage regulator and uses a voltage limiter to control power distributed to the devices. The voltage limiter is used to generate a bias voltage based on the voltage potential of the SRAM cell power supply and the voltage potential of the SRAM periphery power supply. In some embodiments, the voltage limiter is used to maintain an internal SRAM cell power supply voltage that tracks the internal SRAM cell peripheral voltage with a predetermined offset.

Figure 1:
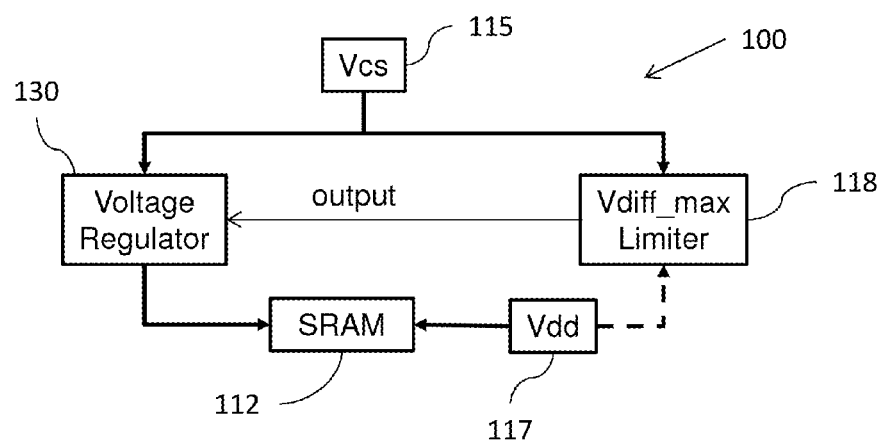
FIG. 1 is a block diagram illustrating embodiments of an integrated circuit herein.
Figure 2:
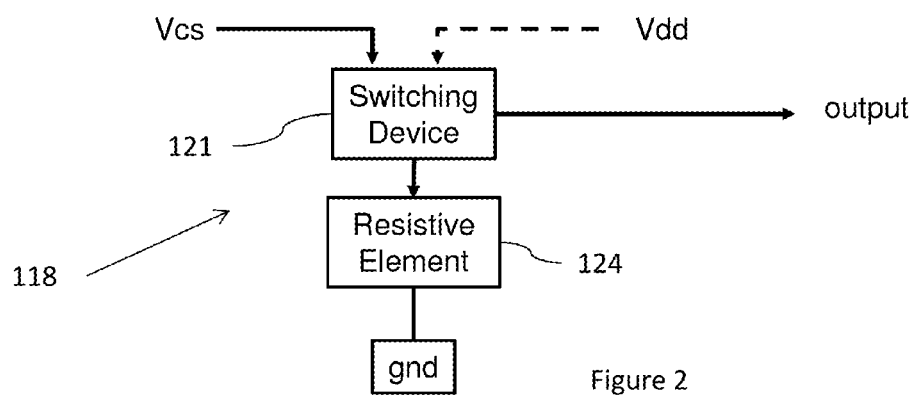
FIG. 2 is a block diagram of a voltage limiter used in the integrated circuit shown in FIG. 1.

Referring to the drawings, FIGS. 1 and 2 illustrate one exemplary embodiment where an integrated circuit structure, indicated generally as 100, comprises an SRAM structure 112. Static random-access memory is a type of semiconductor memory where the word static indicates that it does not need to be periodically refreshed, because SRAM uses latching circuitry to store each bit of data. SRAM data is eventually lost, however, when the memory is not powered. One example of an SRAM is a cross-coupled six transistor SRAM cell. An SRAM cell typically includes a pair of memory nodes separated by a feedback loop. Each bit in the SRAM is stored on four transistors that form two cross-coupled inverters. Two additional access transistors serve to control the access to a storage cell during read and write operations. The feedback loop may include any number and/or combination of circuit elements as is known to those of ordinary skill The storage cell has two stable states that are used to denote 0 and 1.

A power supply 115 is operatively connected to the SRAM structure 112, and provides a first voltage (Vcs) to the SRAM structure 112. The power supply 115 supplies power supply voltage to the SRAM structure 112 through a voltage regulator 130. To retain data in an SRAM structure, power must be applied to the cell. If power is removed from the cell, then the data stored therein is lost. It is likely that for a majority of the time that power is being applied to the SRAM, that power is being consumed in a standby or light sleep mode between instances of a read or write operation (active read/write mode).

A voltage limiter 118 is operatively connected to the power supply 115 and voltage regulator 130. The voltage limiter 118 comprises a switching device 121 operatively connected to the power supply 115. Two voltages are provided to the switching device 121. The switching device 121 receives the first cell supply voltage (Vcs) and a second voltage (Vdd) sometimes referred to as the drain voltage 117. A resistive element 124 is operatively connected to the switching device 121. The switching device 121 connects the resistive element 124 to the power supply 115. The resistive element 124 is selected to cause the switching device 121 to produce an output control signal to the voltage regulator 130 when a difference between the first voltage (Vcs) and the second voltage (Vdd) exceeds a predetermined voltage threshold (Vt).

The power supply 115 provides electrical energy to one or more SRAMs. In an embodiment described herein, the power supply 115 provides the SRAM cell power supply voltage (Vcs). When a commonly used voltage regulator, such as 130, is applied, the voltage supplied to the SRAM may be referred to as V_Vcs. The SRAM peripheral logic voltage (Vdd) is the voltage that is supplied to devices outside the SRAM structure.

The voltage limiter 118 may be used to generate a bias voltage based on the voltage potential of the SRAM cell power supply (Vcs) and the voltage potential of the SRAM periphery power supply (Vdd). The bias voltage may be referred to herein as Vdiff_max. The bias voltage is an output control signal to the voltage regulator 130 that is used to regulate the supply voltage (Vcs) to regulated cell power V_Vcs.

Figure 3:
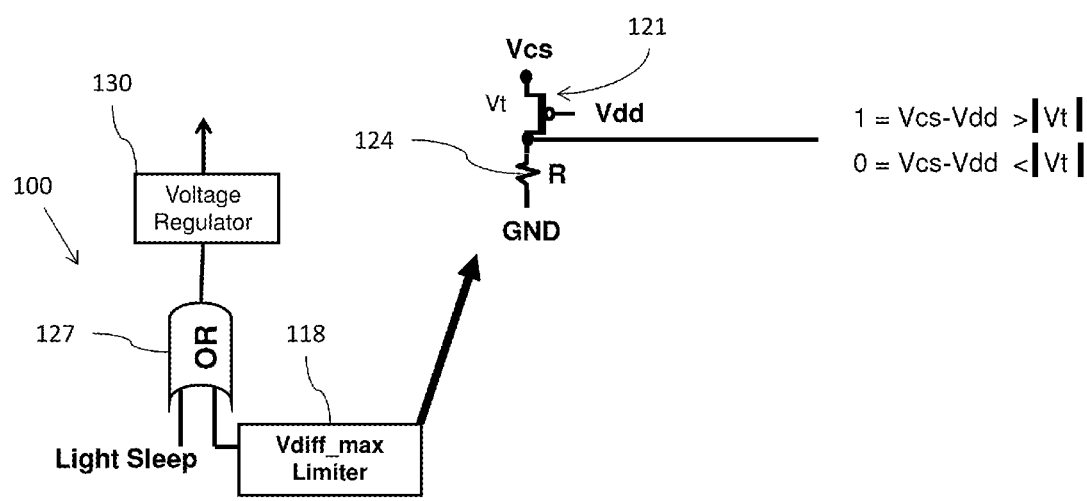
FIG. 3 is a schematic diagram of a voltage limiter used in the integrated circuit shown in FIG. 2.

As shown in FIG. 3, the switching device 121 may be embodied in a Positive Channel Field Effect Transistor (pFET). Other switching devices, such as Negative Channel Field Effect Transistor (nFET) or other appropriate semiconductor devices may be used. The switching device 121 can take any appropriate form such as relays, solid-state relays, transistors, or any other suitable means for switching and can comprise any material appropriate for the given purpose whether now known or developed in the future.

According to one embodiment, the resistive element 124 is selected to maintain the output node of the switching device 121 low when the switching device 121 is operating in the sub-threshold region, in other words it should only compensate for the WC leakage out of the pFET device. The resistive element may be selected to minimize the difference between cell power supply voltage (Vcs) and the SRAM peripheral logic voltage (Vdd).

In the embodiment illustrated in FIG. 3, the integrated circuit structure 100 includes a logic circuit 127 indicated as an OR gate. This logic circuit 127 can be a NAND, NOR, AND, OR, etc., circuit depending upon specific implementation. The output of the voltage limiter 118 is input to the logic circuit 127 and combined with another input to the logic circuit 127 to produce an output that feeds a voltage regulator 130 for active and inactive SRAM devices. For example, if the SRAM is in light sleep mode, the voltage regulator 130 receives a signal to control V_Vcs voltage; alternatively, if the SRAM device is not in light sleep, but the difference between cell power supply voltage (Vcs) and the SRAM peripheral logic voltage (Vdd) exceeds a predetermined voltage threshold (Vt), then the voltage regulator 130 receives a signal to control V_Vcs voltage.

Multiple embodiments are possible. The various embodiments disclosed herein describe improved Vcs to Vdd relationship control within SRAM power savings options. One example of power saving is to put the SRAM bank into light sleep in which SRAM cell power-supply (Vcs) is reduced by some changed Vcs that allows the data to be retained while saving leakage power.

For example, one embodiment, such as shown in FIGS. 1 and 2, uses a voltage regulator to apply V_Vcs on both active and inactive banks. In a first embodiment, a light-sleep mode is already attached to simply not wake up the array if the light sleep Vcs value maintains the proper Vcs to Vdd relationship while in light sleep. That is, the voltage limiter 118 is applied to the voltage regulator 130 based on the threshold voltage (Vt).

In another embodiment, a Vcs regulator provides better voltage drop granularity during SRAM light sleep depending on the external Vcs to Vdd relationship. In some embodiments, multiple drop voltages can be achieved through a series of voltage limiters with different resistive elements. Several voltage limiter devices can be connected in parallel, each having a separate threshold voltage (Vt) resulting in different switching device thresholds allowing an increase in V_Vcs as the Vdiff_max increases. In such embodiment, each resistive element is sized differently for different SRAM structures. In all cases, however, the maximum voltage drop should never jeopardize the Vcs_min voltage.

In another embodiment, the resistive element may be sized differently for different design goals. Typically, cell power supply voltage (Vcs) is applied to an SRAM bank. In such embodiment, a Vcs to Vdd voltage limiter is integrated into the SRAM control block.

In another embodiment, selective voltage bins (SVB) may be used to set the drop from Vcs to L_Vcs for selected SRAMs. In other words, if a specific SRAM structure has been limited to specific power or voltage levels by a selective voltage binning process, the resistive element can be sized for each specific SRAM to comply with the voltage requirements of the selective voltage binning processes.

In summary, the integrated circuit includes a static random access memory (SRAM) structure and a limiter circuit operatively connected to the SRAM structure. The limiter circuit includes a switching device having two voltage inputs and a resistive element operatively connected to the switching device to limit a maximum voltage supplied to the SRAM structure when a difference between said the two voltages is greater than a voltage threshold value of the switching device.

The integrated circuit described herein provides improved yield for the SRAM structure by reducing writability failures. Moreover, the integrated circuit can drastically reduce power consumption while taking up very little room in the SRAM structure.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit comprising:
    a static random access memory (SRAM);
    a logic circuit; and
    a limiter circuit operatively connected to said SRAM, said limiter circuit comprising:
        a switching device having a first input connected to a first voltage supply, and a second input connected to a second voltage supply; and
        a resistive element operatively connected to said switching device,
    said resistive element being selected to enable an output from said switching device to said logic circuit when a difference between said first voltage and said second voltage is greater than a voltage threshold value of said switching device.

2. The integrated circuit according to claim 1, said logic circuit comprising an OR gate.

3. The integrated circuit according to claim 1, said resistive element being sized differently for different SRAM structures.

4. The integrated circuit according to claim 1, said resistive element being sized differently for different design goals.

5. The integrated circuit according to claim 1, said resistive element comprising at least one resistor connected to ground.

6. The integrated circuit according to claim 1, said switching device comprising at least one transistor.

7. The integrated circuit according to claim 1, said SRAM comprising an array of memory elements.

8. An integrated circuit comprising:
    a static random access memory (SRAM) structure;
    a logic circuit;
    a power supply operatively connected to said SRAM structure, said power supply providing a first voltage to said SRAM structure; and
    a voltage limiter operatively connected to said power supply, said voltage limiter comprising:
        a switching device operatively connected to said power supply, said switching device receiving said first voltage and receiving a second voltage supplied to structures external to said SRAM structure; and
        a resistive element operatively connected to said switching device, said switching device connecting said resistive element to said power supply,
    said resistive element being selected to enable an output from said switching device to said logic circuit when a difference between said first voltage and said second voltage is greater than a voltage threshold value of said switching device.

9. The integrated circuit structure according to claim 8, said logic circuit comprising an OR gate and an output of said logic circuit enables a voltage regulation circuit to provide voltage to said SRAM structure.

10. The integrated circuit structure according to claim 8, said resistive element being sized differently for different SRAM structures.

11. The integrated circuit structure according to claim 8, said resistive element being sized differently for different design goals.

12. The integrated circuit structure according to claim 8, said resistive element comprising at least one resistor connected to ground.

13. The integrated circuit structure according to claim 8, said switching device comprising at least one transistor.

14. The integrated circuit structure according to claim 8, said SRAM structure comprising an array of memory elements.

15. An integrated circuit structure comprising:
    a static random access memory (SRAM) structure;
    a logic circuit, comprising an OR gate;
    a power supply operatively connected to said SRAM structure, said power supply providing a first voltage to said SRAM structure through a voltage regulator;

a voltage limiter operatively connected to said power supply, said voltage limiter comprising:
   at least one transistor operatively connected to said power supply, said at least one transistor receiving said first voltage and receiving a second voltage supplied to structures external to said SRAM structure; and
   at least one resistor operatively connected to said at least one transistor, said at least one transistor connecting said at least one resistor to said power supply, and
   said at least one resistor being selected to enable an output from said at least one transistor to said logic circuit when a difference between said first voltage and said second voltage is greater than a voltage threshold value of said at least one transistor.

16. The integrated circuit structure according to claim 15, said at least one resistor being selected to minimize said difference between said first voltage and said second voltage.

17. The integrated circuit structure according to claim 15, said at least one resistor being sized differently for different SRAM structures.

18. The integrated circuit structure according to claim 15, said at least one resistor being sized differently for different design goals.

19. The integrated circuit structure according to claim 15, said at least one resistor being connected to ground.

20. The integrated circuit structure according to claim 15, said SRAM structure comprising an array of memory elements.

* * * * *